US012191850B2

(12) United States Patent
D'Angelo et al.

(10) Patent No.: US 12,191,850 B2
(45) Date of Patent: *Jan. 7, 2025

(54) ISOLATED GATE DRIVER DEVICE FOR A POWER ELECTRICAL SYSTEM AND CORRESPONDING POWER ELECTRICAL SYSTEM

(71) Applicant: STMicroelectronics S.r.l., Agrate Brianza (IT)

(72) Inventors: Vittorio D'Angelo, Nocera Superiore (IT); Salvatore Cannavacciuolo, Villaricca (IT); Valerio Bendotti, Vilminore di Scalve (IT); Paolo Selvo, Milan (IT); Diego Alagna, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/328,266

(22) Filed: Jun. 2, 2023

(65) Prior Publication Data

US 2023/0308097 A1    Sep. 28, 2023

Related U.S. Application Data

(62) Division of application No. 17/807,519, filed on Jun. 17, 2022, now Pat. No. 11,722,133.

(30) Foreign Application Priority Data

Jun. 30, 2021  (IT) .................. 102021000017264

(51) Int. Cl.
*H03K 17/00* (2006.01)
*H03K 3/017* (2006.01)
(Continued)

(52) U.S. Cl.
CPC .......... *H03K 17/567* (2013.01); *H03K 3/017* (2013.01); *H03K 7/08* (2013.01); *H03K 17/18* (2013.01);
(Continued)

(58) Field of Classification Search
CPC ........ H03K 17/567; H03K 3/017; H03K 7/08; H03K 17/687; H03K 17/689; H03K 17/18; H03M 1/504
See application file for complete search history.

(56) References Cited

U.S. PATENT DOCUMENTS 9,673,809 B1  6/2017  Kandah et al.
9,705,485 B1  7/2017  Finfter
(Continued)

FOREIGN PATENT DOCUMENTS

WO    2015066087 A1    5/2015

*Primary Examiner* — Tuan T Lam
(74) *Attorney, Agent, or Firm* — Slater Matsil, LLP

(57) ABSTRACT

In an embodiment a method includes receiving, at an input of a low-voltage section of a gate driver, a PWM control signal with a switching frequency, providing, at an output of a high-voltage section of the gat driver, a gate-driving signal as a function of the PWM control signal to a power stage, wherein the high-voltage section is galvanically isolated from the low-voltage section, receiving, at a feedback input of the high-voltage section, at least one feedback signal indicative of an operation of the power stage, converting, at an ADC module of the high-voltage section, the feedback signal into a digital data stream, providing, to the ADC module, a conversion-trigger signal designed to determine a start of a conversion for acquiring a new sample of the feedback signal and sending, via an isolation communication channel between the low-voltage section and the high-voltage section, the digital data stream to the low-voltage section.

20 Claims, 5 Drawing Sheets

(51) Int. Cl.
  *H03K 7/08* (2006.01)
  *H03K 17/18* (2006.01)
  *H03K 17/567* (2006.01)
  *H03K 17/687* (2006.01)
  *H03K 17/689* (2006.01)
  *H03M 1/50* (2006.01)

(52) U.S. Cl.
  CPC ......... *H03K 17/687* (2013.01); *H03K 17/689* (2013.01); *H03M 1/504* (2013.01)

(56) References Cited

U.S. PATENT DOCUMENTS

| | | |
|---|---|---|
| 10,511,291 B1 | 12/2019 | Kandah et al. |
| 2016/0018446 A1* | 1/2016 | Chen .................... H03K 17/00 363/56.05 |
| 2017/0117815 A1 | 4/2017 | Sato |
| 2017/0149428 A1* | 5/2017 | Mauerer ............... H02M 3/157 |
| 2019/0199227 A1* | 6/2019 | Radic .................... H02M 3/335 |
| 2021/0028701 A1 | 1/2021 | Dharmalinggam et al. |
| 2021/0119627 A1 | 4/2021 | Lee et al. |
| 2022/0116249 A1 | 4/2022 | Briseno-Vidrios et al. |
| 2022/0182052 A1 | 6/2022 | Heckroth et al. |

* cited by examiner

ISOLATED GATE DRIVER DEVICE FOR A POWER ELECTRICAL SYSTEM AND CORRESPONDING POWER ELECTRICAL SYSTEM

CROSS-REFERENCE TO RELATED APPLICATIONS

This application is a divisional application of U.S. application Ser. No. 17/807,519 filed Jun. 17, 2022 which claims the benefit of Italian Patent Application No. 102021000017264, filed on Jun. 30, 2021, which applications are hereby incorporated herein by reference.

TECHNICAL FIELD

The present solution relates to an isolated gate driver device for an electrical power system, for example a converter or an inverter for high-voltage applications, and to a corresponding electrical power system.

BACKGROUND

Power converters, for example for SMPS (Switched-Mode Power Supply) applications, traction inverters (for example for automotive applications, for driving a three-phase traction motor), or in general electrical power systems are known, which envisage the use of power switches (for example, made with SiC, GaN, MOSFET, IGBT technology) to implement transfer of power to an electrical load.

SUMMARY

Various embodiments provide an isolated gate driver device with improved characteristics and performance.

Various further embodiments provide an isolated gate driver device and a corresponding electrical power system.

BRIEF DESCRIPTION OF THE DRAWINGS

For a better understanding of the present invention preferred embodiments thereof are now described, purely by way of non-limiting example, with reference to the attached drawings.

DETAILED DESCRIPTION OF ILLUSTRATIVE EMBODIMENTS

In isolated gate driver devices, galvanic isolation may be required between a corresponding control stage, which, for example, includes a microcontroller or similar processing unit, which is designed to control operation of the power switches according to a desired logic and operates at low voltage, and a corresponding driving stage, which includes the circuit elements required for driving the same power switches and operates at high voltage.

In particular, the microcontroller, which executes an appropriate control algorithm, is generally required to operate at a certain distance from the power stage in order to prevent any malfunctioning caused by an excessive heat dissipation and by electromagnetic interference (EMI) due to the high-power switching activity.

Galvanic isolation may therefore be required between the control section and the power section so as to minimise the aforesaid undesired effects and moreover guarantee safety of the operators. Based on the applications, the isolation may be of a functional, basic, or double/reinforced type.

In such electrical systems, the use of isolated gate driver devices is therefore envisaged, in order to provide the aforesaid galvanic isolation and thus enable control and driving of the power switches, in particular of the corresponding control terminals (gate terminals).

Figure 1:
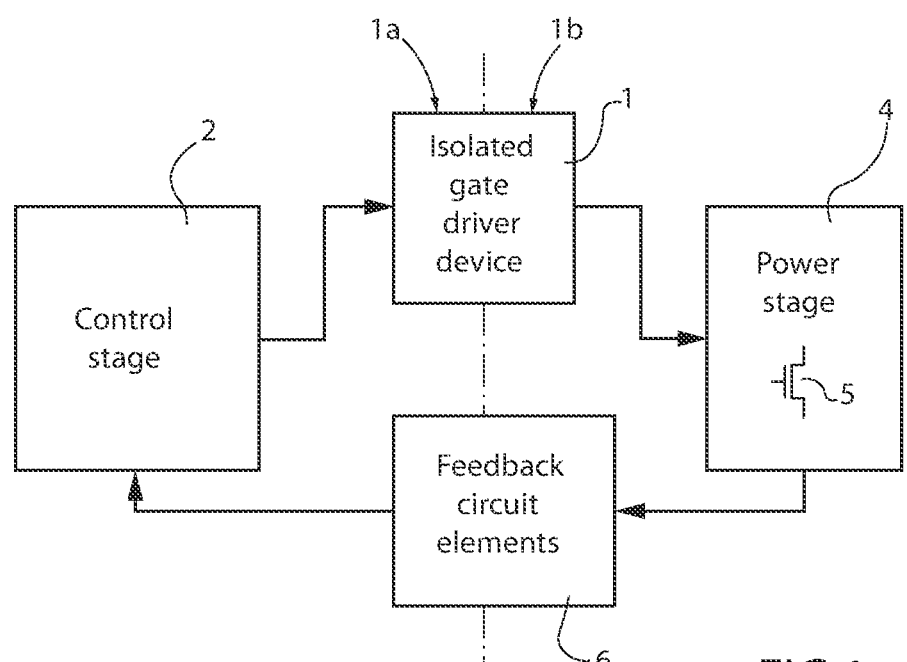
FIG. 1 shows a general block diagram of an electrical power system including an isolated gate driver device, of a known type.

As illustrated schematically in FIG. 1, an isolated gate driver device 1 is generally configured to receive from a control stage 2, including, for example, a microcontroller, low-voltage switching-control signals, for example pulse-width-modulation (PWM) signals, and to generate (high-voltage) power signals for driving a power stage 4, which includes one or more power switches 5.

In particular, the isolated gate driver device 1 is configured to provide a galvanic isolation between the control stage 2 and the power stage 4; for example, in a possible embodiment, the isolated gate driver device 1 comprises: a low-voltage section 1a, coupled to the control stage 2; and a high-voltage section 1b, coupled to the power stage 4 and galvanically isolated from the low-voltage section 1a.

In order to obtain a closed-loop control, the control stage 2 is moreover required to receive from the power stage 4 suitable feedback signals, preferably acquired in real time. Furthermore, the feedback signals are required not to be affected by switching noise and to be transferred to the control stage 2 in a reliable manner, guaranteeing the corresponding integrity.

Known solutions envisage the use of feedback circuit elements, designated as a whole by 6 in the aforesaid FIG. 1, external to the isolated gate driver device 1, which include, for example (in a way not illustrated), elements for acquisition and amplification of the feedback signals from the power stage 4 and isolator elements, for isolated transmission of the feedback signals to the control stage 2.

Such known solutions have, however, the drawbacks of a difficult integration in a limited area and of a reliability that may be less than expected, in particular during the switching operation.

An isolated gate driver device has moreover been proposed, produced by Texas Instruments under the code UCC5870-Q1, which performs in an integrated manner not only a function of driving of a corresponding power stage based on PWM control signals received from a control stage, but also a function of communication of the feedback signals indicative of the operation of the same power stage.

In particular, this isolated gate driver device integrates: an ADC (Analog-to-Digital Converter) for receiving the feedback signals and converting them into digital signals (based on timing commands received from the control stage); and a bi-directional communication module, which in particular implements a communication line of a full-duplex type, for communication of these digital signals from a high-voltage section, coupled to the power stage, to a low-voltage section, coupled to the control stage.

The aforesaid isolated gate driver device has the advantage of not requiring external circuit stages, thus enabling in general a saving of area and a greater freedom in the design of the resulting electrical system.

The present Applicant has, however, realized that the above device has some drawbacks.

In the first place, implementation of the aforesaid bi-directional communication module requires a full-duplex communication in order to constantly update registers of the low-voltage section, preventing any conflicts with possible asynchronous commands arriving from the control stage; the full-duplex communication implies two independent isolation lines (one for transmission and the other for reception) with consequent area occupation.

Moreover, implementation of the bi-directional communication module requires a fast communication protocol for rapidly exchanging the digital signals, before arrival of a new edge of the PWM control signal; a higher speed in general means a higher current consumption.

The possibility of a new sample of the feedback signal not being correctly acquired may moreover arise in the case, for example, where the value of the duty-cycle of the control signal is very small or very high. In particular, this may occur even though an ADC with a very short conversion time (equal to 5.1 µs) is used; in this regard, it may be noted that a short conversion time leads to a consequent reduced immunity to noise.

To guarantee acquisition as far as possible in real time, the implementation moreover requires transmission of a "time-stamp" on the communication line; this implies a higher burden for the communication protocol.

Moreover, the system does not enable conversions on request by the control stage, which would instead be particularly useful for carrying out diagnostic checks upon switching-on, such as measurement of the gate threshold voltage, or for carrying out a so-called HardWare Self Check (HWSC).

The system also has an upper limit for the switching frequency, equal to 30 kHz, which may prove insufficient for some applications.

Figure 2:
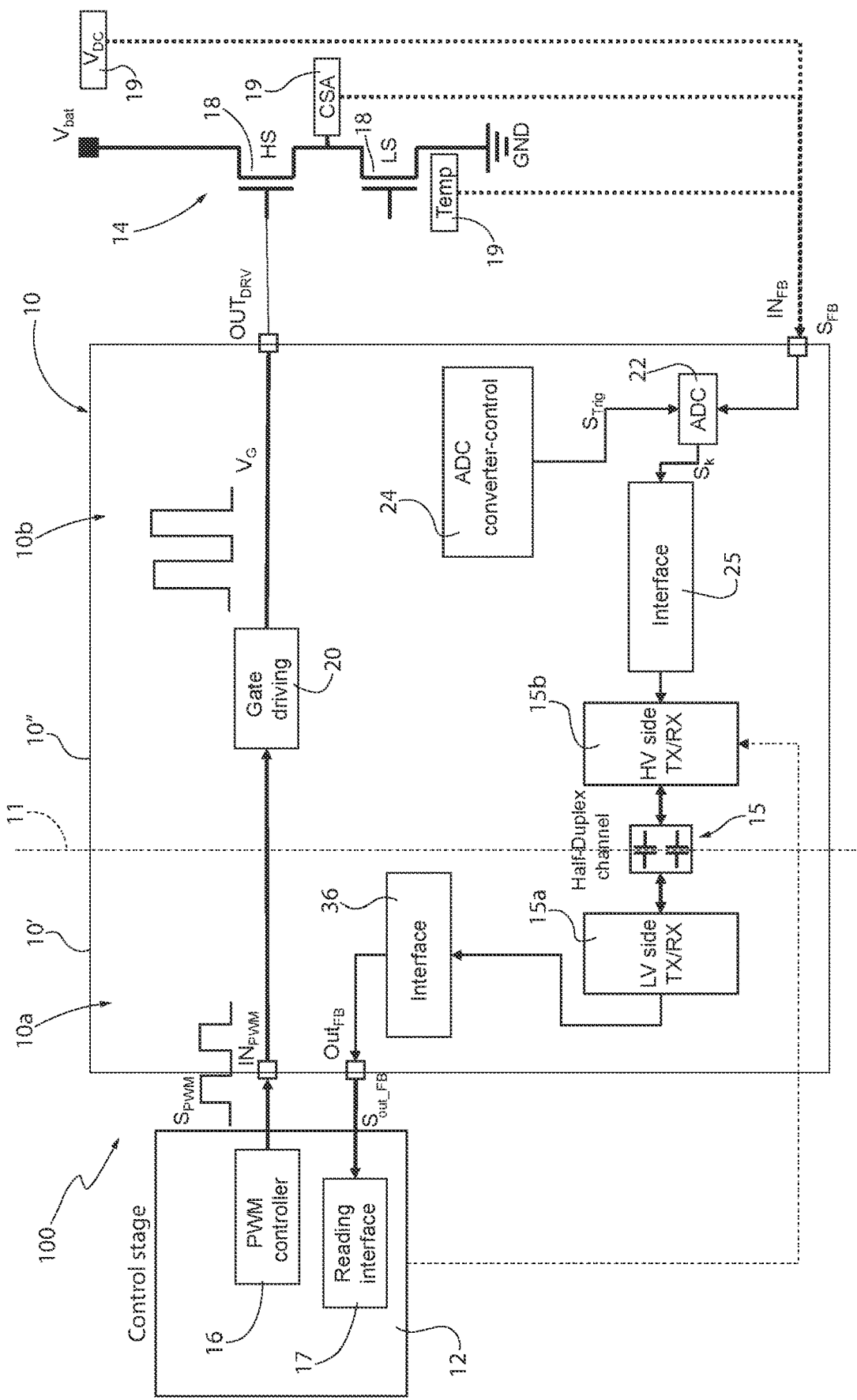
FIG. 2 shows a general block diagram of an electrical power system including an isolated gate driver device, according to an embodiment of the present solution.

As shown in FIG. 2, an isolated gate driver device 10 comprises, according to an embodiment of the present solution:

a low-voltage section 10a, which has a control input $IN_{PWM}$, which is designed to receive, from a control stage 12 of an associated electrical power system 100, PWM control signals $S_{PWM}$ at a switching frequency $f_{PW\_HV}$ (and corresponding switching period $T_{PW\_HV}$) and moreover a feedback output $OUT_{FB}$, which is designed to supply to the control stage 12 feedback output signals $S_{OUT\_FB}$, indicative of the operation of a power stage 14 of the electrical power system 100, which is coupled to the same isolated gate driver device 10;

a high-voltage section 10b, galvanically isolated from the low-voltage section 10a, having a driving output $OUT_{DRV}$, which is designed to supply gate-driving signals $V_G$ to the power stage 14, and a feedback input $IN_{FB}$, which is designed to receive at least one feedback signal $S_{FB}$, indicative of the operation of the same power stage 14 (it is noted that the feedback input $IN_{FB}$ may possible be used in multiplexing, for receiving a plurality of feedback signals $S_{FB}$); and a communication channel 15, configured to provide a half-duplex type communication through capacitive coupling between the low-voltage section 10a and the high-voltage section 10b.

In a possible embodiment, the low-voltage section 10a and the high-voltage section 10b are made with two distinct dies of semiconductor material 10', 10", separated from one another by a galvanic-isolation barrier 11.

The aforesaid communication channel 15 couples in communication the low-voltage and high-voltage sections 10a, 10b, enabling transfer of information and signals through the aforesaid galvanic-isolation barrier 11.

In particular, a first communication module (a transceiver module, RX/TX) 15a in the low-voltage section 10a (or low-voltage, LV, side) acts as master, sending queries at a given polling frequency $f_{POL}$, for example 20 kHz, according to a question-and-answer (Q&A) mechanism. A corresponding second communication module (a transceiver module, RX/TX) 15b in the high-voltage section 10b (or high voltage, HV, side) acts, instead, as slave, answering the queries received.

The question-and-answer thread may also be interrupted by asynchronous communication events (so-called interrupts) due to activity by the control stage 12, the communication channel 15, in particular the second communication module 15b, being in any case configured so as to manage the priorities of the threads, preventing any conflicts (as described in greater detail hereinafter).

The aforesaid control stage 12, external to the isolated gate driver device 10, is provided with a microcontroller, or a similar processing unit, and comprises in particular: a PWM controller 16, configured to generate the low-voltage PWM control signals $S_{PWM}$, as a function of a desired control strategy for the power stage 14; and a reading interface 17, configured to receive the feedback output signals $S_{OUT\_FB}$.

The aforesaid power stage 14 comprises one or more power switches 18, for example made with SiC, GaN, MOSFET, IGBT technology which are driven in switching mode to obtain transfer of power to an electrical load, for example a three-phase motor (not illustrated herein).

In particular, the power switches 18, of which, byway of example, FIG. 2 illustrates a high-side switch HS, coupled to a battery power-supply terminal $V_{bat}$ (in turn coupled to a power-supply battery through a stabilisation capacitor, here not illustrated), and a low-side switch LS, coupled to a reference or ground terminal GND, have a corresponding gate terminal coupled to the driving output $OUT_{DRV}$, so as to receive the corresponding gate-driving signal $V_G$.

It is noted that, in general, as many isolated gate driver devices 10 will be present as are the power switches 18 in the power stage 14 of the electrical power system 100.

The power stage 14 further comprises suitable sensor elements, designated as a whole by 19, for acquisition of the feedback signals $S_{FB}$, indicative of the operation of the power stage 14, amongst which, for example, temperature signals (TEMP), voltage signals ($V_{DC}$), and current signals (CSA), required by the control stage 12 to implement the desired control strategy.

For instance, in the case where the electrical load is a three-phase electric motor, these feedback signals $S_{FB}$ may comprise: a voltage $V_{DC}$ on the stabilisation capacitor, which may, for example, be detected for applying a correction factor to the phase duty-cycle, according to the control strategy; a phase current CSA, which may be acquired for controlling the torque of the three-phase electric motor; and a temperature TEMP associated with a power switch 18, which may be acquired for safety reasons and for applying a variable-switching-frequency strategy in order to provide thermal relief.

In detail, the aforesaid high-voltage section 10*b* comprises:

- a driving module 20, configured to generate the high-voltage gate-driving signals $V_G$, starting from the low-voltage PWM control signals $S_{PWM}$ (the gate-driving signals $V_G$ consequently being pulse-width-modulated signals switching between an ON state and an OFF state, with a corresponding value of duty-cycle and frequency);
- an ADC (Analog-to-Digital Converter) module 22, configured to receive the feedback signals $S_{FB}$ and convert them into a digital data stream, in particular a new sample $S_k$ being acquired at each cycle (or period) of the PWM control signal $S_{PWM}$;
- a conversion-control module 24, coupled to the ADC module 22 for supplying to the same ADC module 22 a conversion-trigger signal $S_{Trig}$, which determines in an automatic manner, on the basis of an optimisation logic executed inside the isolated gate driver device 10 (which will be described in detail hereinafter), the start of conversion (SoC) for acquisition of a new sample $S_k$ of a corresponding feedback signal $S_{FB}$; and
- a first interface module 25, designed to receive the digital data stream from the ADC module 22 and supply it in an appropriate manner to the second communication module 15*b*, to be sent over the communication channel 15 towards the low-voltage section 10*a*.

In detail, the ADC module 22 acquires the feedback signals $S_{FB}$ with a conversion time $T_{CONV}$ (for example, 10 µs) suitable for the specific application. The configuration of the ADC module 22 is such as to guarantee an acquisition free of noise, albeit satisfying the Nyquist criteria to prevent aliasing. For high-frequency switching applications, it is possible to implement a high-speed ADC (for example, of a flash/SAR type) with a subsequent filtering chain; instead, low-frequency switching applications may benefit from a slower ADC topology, such as a sigma-delta, $\Sigma\Delta$, modulator.

Figure 3:
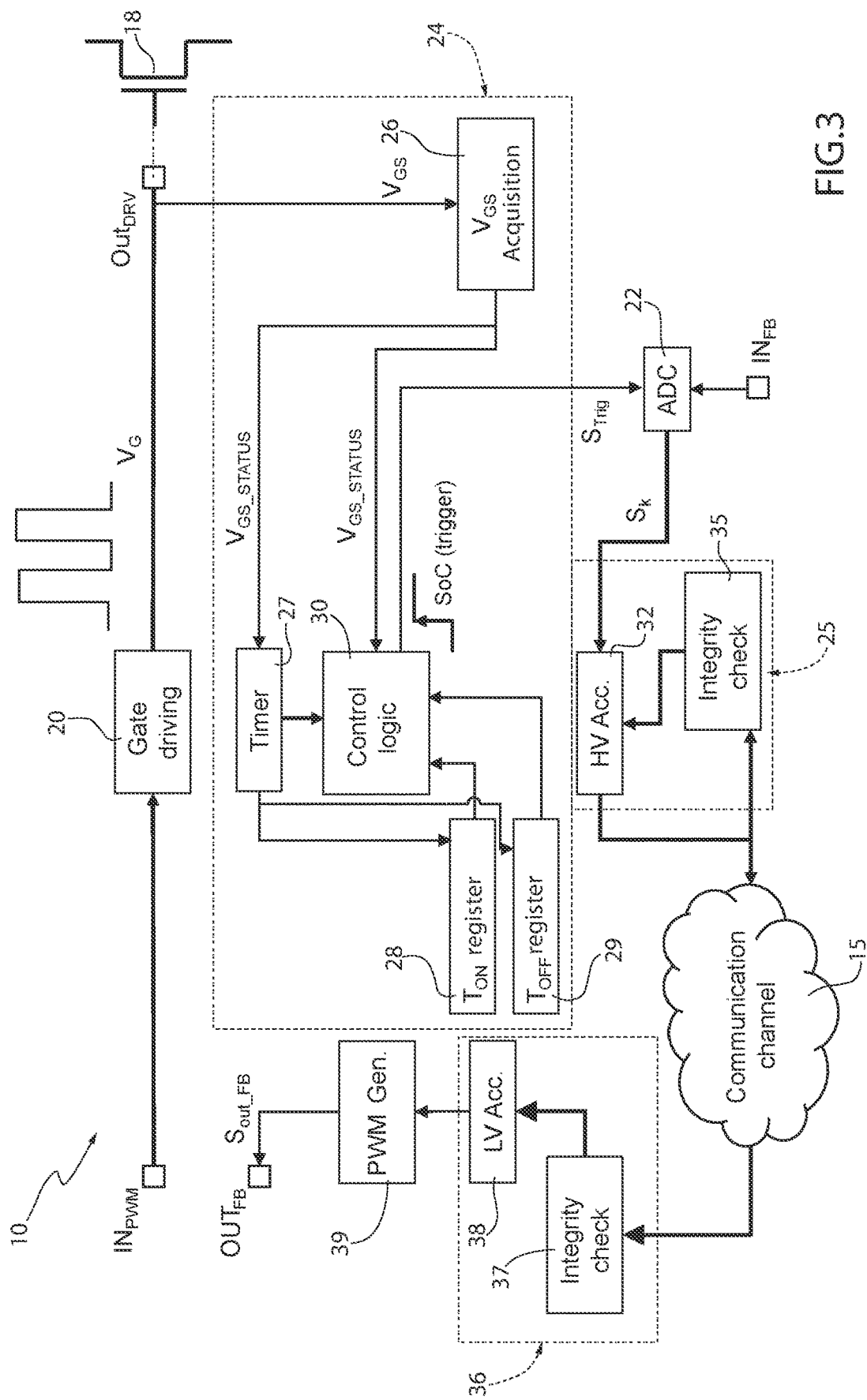
FIG. 3 shows a more detailed block diagram of the isolated gate driver device of FIG. 2.

According to a particular aspect of the present solution, as shown in detail in FIG. 3, the conversion-control module 24 comprises:

- an acquisition block 26, including an analog comparator that acquires the value of a gate-to-source voltage $V_{GS}$ of a respective power switch 18 (or, alternatively, the voltage of the gate-driving signal $V_G$ or another quantity indicative of the operating status of the same switch) and compares it with a fixed threshold value $V_{TH}$ (for example, equal to 70% of the target value of the gate-to-source voltage $V_{GS}$ in the ON state), thus detecting the ON/OFF transitions and supplying a status signal $V_{GS\_STATUS}$ indicative of the operating status of the power switch 18 (it is noted that the bandwidth of the aforesaid analog comparator is compatible with the rise/fall times of the output, for example tens of nanoseconds, so as not to introduce an excessive latency into the activation sequence of the ADC module 22);
- a timer block 27, which receives the status signal $V_{GS\_STATUS}$ from the acquisition block 26 and is reset and restarted at the transitions of the same status signal $V_{GS\_STATUS}$, thus measuring the duration of the ON interval, $T_{ON}$, and of the OFF interval, $T_{OFF}$ (it is noted that the resolution and the interval of the aforesaid timer are compatible with the switching frequency of the gate-driving signal $V_G$ and with the minimum/maximum value of the corresponding duty-cycle);
- a first register 28, coupled to the timer block 27 for storing the duration of the ON interval $T_{ON}$;
- a second register 29, coupled to the same timer block 27 for storing the duration of the OFF interval $T_{OFF}$; and
- a control-logic block 30, coupled to the aforesaid first and second registers 28, 29 for receiving the aforesaid durations of the ON and OFF intervals $T_{ON}$, $T_{OFF}$ and moreover to the acquisition block 26 for receiving the aforesaid status signal $V_{GS\_STATUS}$.

In greater detail, the control-logic block 30 collects information on the operating status of the output from the acquisition block 26 and combines the same operating status with the measurements of duration of the ON interval $T_{ON}$ and OFF interval $T_{OFF}$ to determine the most convenient instant in time for activating the start of conversion by the ADC module 22.

In particular, given the switching period $T_{PWM\_HV}$ (for example, equal to 25 µs in the case of a switching frequency $f_{PWM\_HV}$ of 40 kHz) associated with the PWM control signal $S_{PWM}$, the logic implemented by the control-logic block 30 envisages that:

- if $T_{ON} > T_{CONV} + T_{GUARD}$, the acquisition is carried out during the ON interval $T_{ON}$, in particular in a way aligned with the centre of the same ON interval $T_{ON}$;
- otherwise, i.e., if $T_{ON} \leq T_{CONV} + T_{GUARD}$, the acquisition is carried out during the OFF interval $T_{OFF}$, in particular in a way aligned with the centre of the same OFF interval $T_{OFF}$.

It is noted that, in the aforesaid expressions, $T_{GUARD}$ (for example, 2 µs) indicates a guard time interval implemented for guaranteeing start of conversion at a sufficient distance in time from the rise/fall edge of the PWM signal.

Basically, the conversion is started in a way aligned with the centre of the programmed phase of the duty-cycle; to obtain this, the control-logic block 30 observes the state of the output, provided by the status signal $V_{GS\_STATUS}$. When the output evolves into the state programmed for acquisition, the internal timer (timer block 27) is started. If the programmed state of acquisition is 'ON', when the timer reaches the threshold $(T_{ON} - T_{CONV})/2$ (without considering, for reasons of simplicity, in this case the guard time $T_{GUARD}$), the logic generates the start-of-conversion (SoC) pulse by the conversion-trigger signal $S_{Trig}$. Instead, if the programmed state of acquisition is 'OFF', the logic generates the start-of-conversion pulse SoC when the timer reaches the threshold $(T_{OFF} - T_{CONV})/2$ (without considering once again, for reasons of simplicity, the guard time $T_{GUARD}$).

In general, acquisition during the ON interval $T_{ON}$ is preferable in so far as it guarantees a lower noise coupled to the signal (it is known in fact that the "ringing" effect due to switching-on of the switches 18 has a lower intensity than the similar effect due to switching-off of the same switches 18). However, advantageously, when the ON interval $T_{ON}$ is not compatible with the conversion time $T_{CONV}$, the algorithm implemented by the control-logic block 30 shifts autonomously to acquisition in the OFF interval $T_{OFF}$ so as to guarantee continuous sampling of the signal, without any loss of samples in any of the switching cycles (i.e., an effective acquisition in real time of the feedback signals $S_{FB}$).

The time count performed by the timer block 27 therefore enables the control-logic block 30 to determine the exact instant of activation of the ADC module 22 (with adequate approximation, for example equal to 1% of the switching period $T_{PW\_HV}$).

According to a further aspect of the present solution, the first communication-interface module 25 comprises a first accumulator block (HV accumulator) 32, configured to accumulate the samples $S_k$ resulting from the analog-to-digital conversion by the ADC module 22, acting as a moving average filter (with anti-aliasing effect, as also discussed hereinafter).

The size of the first accumulator block 32, NSAMPLES_HV (for example, equal to four) is chosen so as to match the bandwidth of the PWM control signal $S_{PWM}$ (which may even reach 40 kHz) to the polling frequency associated with the communication channel 15 (which may be different, for example equal to 20 kHz) in order to prevent aliasing phenomena.

The first accumulator block 32 is reset whenever a polling query arrives from the communication channel 15.

In greater detail, it is pointed out that the conversion time $T_{CONV}$ equal to 10 µs guarantees correct acquisition of the PWM control signal $S_{PWM}$ up to a frequency of 40 kHz. Acquisition in fact requires having at least 12 µs available either during the ON interval $T_{ON}$ or during the OFF interval $T_{OFF}$; this is guaranteed for any duty-cycle up to the frequency of 40 kHz, since the sum of the intervals $T_{ON}$ and $T_{OFF}$ is in this case always equal to 25 µs.

Furthermore, it is pointed out that the use of an ADC of a $\Sigma\Delta$ type with a conversion time $T_{CONV}$ equal to 10 µs means that the result of the conversion is given by the mean value of the signal acquired over a time window equal to the conversion time $T_{CONV}$; this guarantees a noise-filtering feature, thanks to exploitation of the entire interval $T_{ON}$ (or $T_{OFF}$) for averaging the signal.

In particular, even in the case where the signal is acquired during the OFF interval $T_{OFF}$, the sampling strategy guarantees the best result possible in terms of noise, acquiring the signal at the middle of the OFF interval $T_{OFF}$.

The first communication-interface module 25 further comprises a first integrity check block 35, configured to perform an integrity check and validate the queries received through the communication channel 15 (from the low-voltage section 10a) and activate an answer only in the case of a positive outcome of this integrity check. Otherwise, any query deemed as not conforming (for example, because it is damaged) is eliminated.

The low-voltage section 10a in turn comprises:
- a second interface module 36, provided with a second integrity check block 37 and a second accumulator block (LV accumulator) 38; and
- a PWM generator block 39, for generating the feedback output signals $S_{out\_FB}$ that are supplied to the feedback output $OUT_{FB}$ at an output frequency $f_{OUT\_PWM}$, having a value (for example, equal to 10 kHz) designed to be compatible with the sampling frequency required by the control algorithm being executed in the control stage 12.

In detail, the second integrity check block 37 is configured to reject any packet damaged that is received from the communication channel 15 (by the corresponding first communication module 15a, not illustrated herein for reasons of simplicity) and therefore not add it to the second accumulator block 38.

The second accumulator block 38 is configured to collect in an internal buffer the data gathered by the polling routine being run over the communication channel 15. In particular, the second accumulator block 38 is loaded with a new sample acquired from the ADC module 22 and transmitted over the communication channel 15 only in case where the data received are considered valid, i.e., not corrupted; the same second accumulator block 38 is moreover reset at each new period (of duration $1/f_{OUT\_PWM}$) of the feedback output signals $S_{out\_FB}$ generated by the PWM generator block 39.

The size of the second accumulator block 38, NSAMPLES_LV (for example, equal to two) is suitably chosen based on the aforesaid output frequency $f_{OUT\_PWM}$ of the feedback output signals $S_{out\_FB}$ generated by the PWM generator block 39.

The PWM generator block 39 is thus configured to encode the data stored in the second accumulator block 38, using a square wave with fixed frequency, $F_{OUT\_PWM}$, the duty-cycle of which is determined directly by the result of the analog-to-digital conversion, in particular according to the following expression:

$$T'_{ON_{z-1}} = f(ACC_{z-1}/\text{NSAMPLES\_LV}),$$

where $ACC_{z-1}$ is the content of the second accumulator block 38, determined at the previous sampling instant (z−1), and $T'_{ON_{z-1}}$ is the duration of the ON interval of the aforesaid duty-cycle.

In greater detail, the PWM generator block 39 therefore operates in an altogether asynchronous manner and generates a PWM signal with fixed frequency, $f_{OUT\_PWM}$, the duty-cycle of which depends on the average data stored in the second accumulator block 38, according to the expression previously highlighted.

Whenever a new period of the feedback output signal $S_{out\_FB}$ generated by the PWM generator block 39 starts, the second accumulator block 38 is reset.

The elementary time interval (resolution) of the feedback output signal $S_{out\_FB}$ generated by the PWM generator block 39 depends upon encoding of the data deriving from analog-to-digital conversion. If NBIT (for example, 10 bits) are used for encoding the conversion data, the time resolution will be $f_{OUT\_PWM} \cdot 2^N$.

It is pointed out that the process of acquisition and accumulation in the first accumulator block 32 of the high-voltage section 10b is in this way asynchronous with respect to the polling (question-and-answer) thread being executed over the communication channel 15. In fact, the frequency of accumulation in the first accumulator block 32 is associated with the switching frequency $f_{PWM\_HV}$ of the PWM control signals $S_{PWM}$ generated by the controller stage 12, which is altogether independent of the polling frequency $f_{OL}$ on the aforesaid communication channel 15.

It is moreover pointed out that the PWM generator block 39 can also operate in an altogether asynchronous manner, generating a PWM signal with output frequency $f_{OUT\_PWM}$ that may be different from the aforesaid polling frequency $f_{OL}$ and from the aforesaid switching frequency $f_{PWM\_HV}$.

Figure 4A:
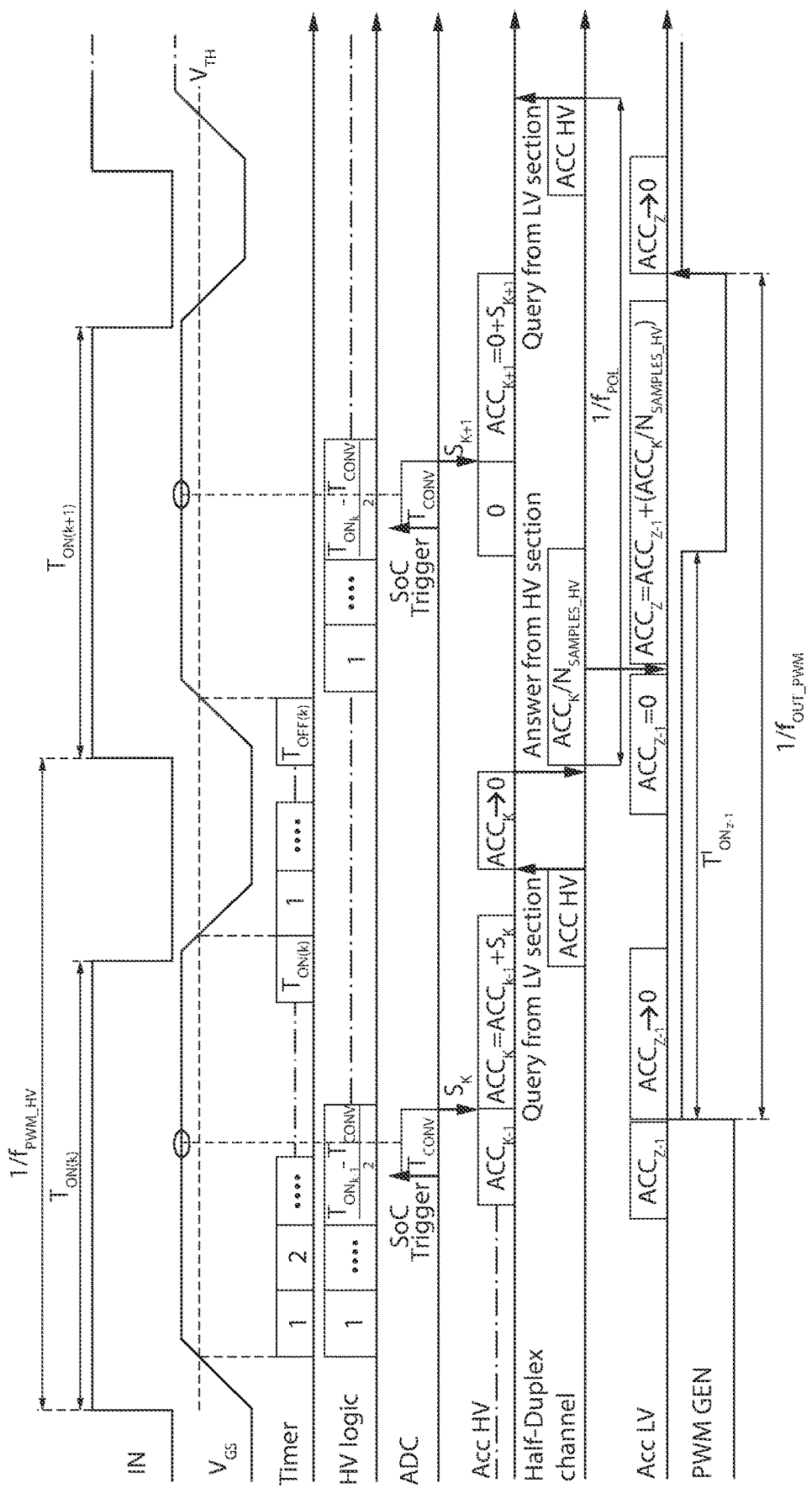
FIGS. 4A and 4B show timing plots regarding operation of the isolated gate driver device of FIG. 2, in respective operating conditions.
Figure 4B:
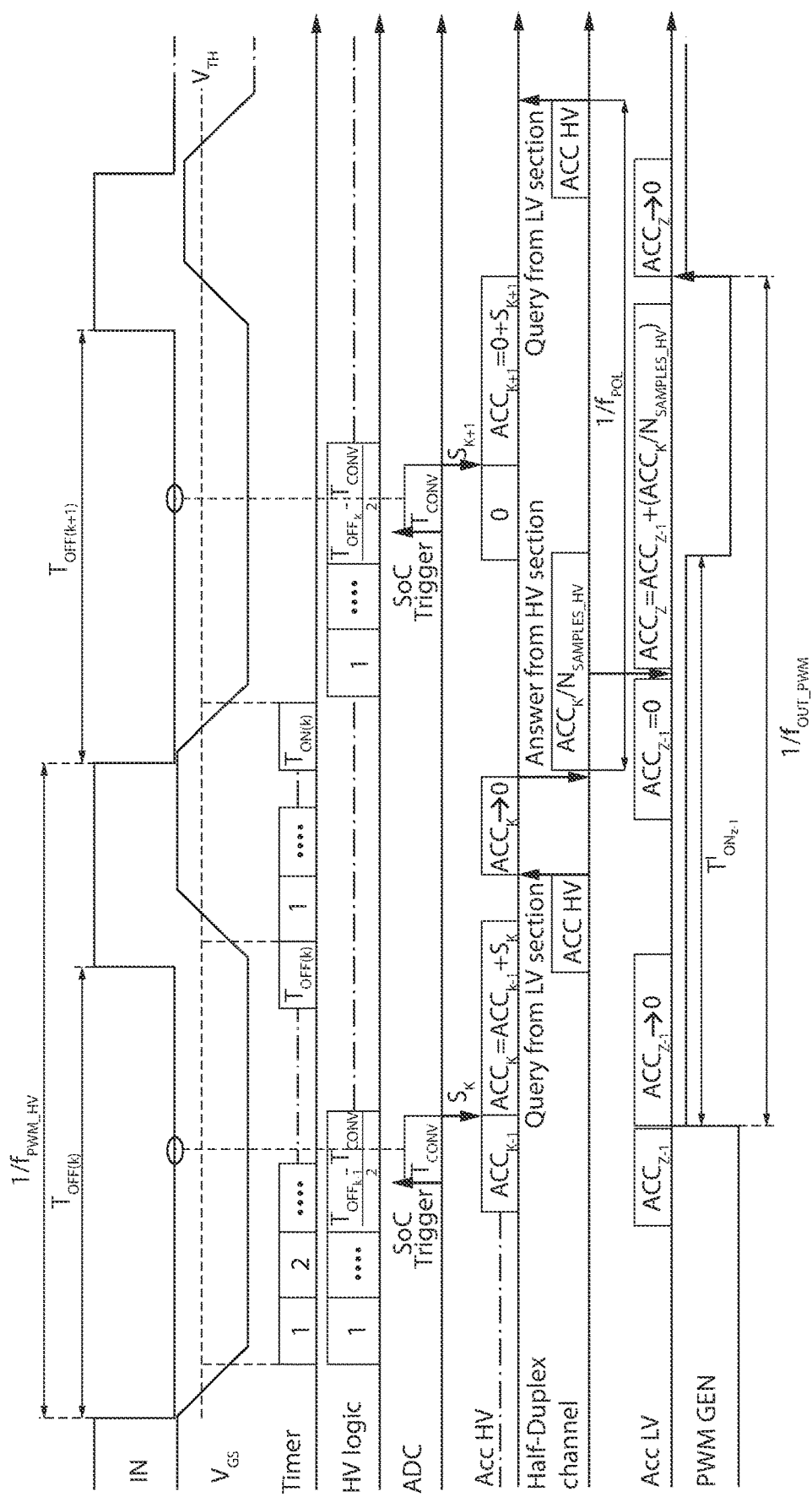

Operation of the isolated gate driver device 1 is now illustrated in further detail with the aid of the timing charts of FIGS. 4A and 4B, which relate to acquisition of a new sample $S_k$ of the feedback signals $S_{FB}$ during the ON interval $T_{ON}$ and during the OFF interval $T_{OFF}$, respectively.

In the example of FIG. 4A, based on the processing operations executed in the previous period (or cycle), the control-logic block 30 of the conversion-control module 24 has programmed the start of conversion of the ADC module 22 during the ON interval $T_{ON}$.

The control stage 12 sets to high the PWM control signal $S_{PWM}$, which is sent at input to the low-voltage section 10a of the isolated gate driver device 10. The signal is then transferred to the high-voltage section 10b of the same isolated gate driver device 10 through the isolation barrier 11 and is further processed by the driving module 20, which generates the equivalent gate-driving signal $V_G$ at a high voltage (for example, with a voltage of 18 V).

Consequently, the gate-to-source voltage $V_{GS}$ of the switch evolves, increasing its value based on the gate-driving signal $V_G$.

When the gate-to-source voltage $V_{GS}$ exceeds the pre-set threshold $V_{TH}$, the analog comparator of the acquisition block 26 switches the status signal $V_{GS\_STATUS}$ at its output and thus activates the timer block 27. At the same time, the control-logic block 30 receives the information that the output (i.e., the coupled power switch 18) is in the ON state.

When the timer reaches the threshold $(T_{ON(k-1)} - T_{CONV})/2$ (where $T_{ON(k-1)}$ is the duration of the ON interval of the previous period, and $T_{CONV}$ is, as mentioned previously, the duration of the analog-to-digital conversion), the conversion-trigger signal $S_{Trig}$ is generated, which causes start of conversion (SoC) for acquisition of a new sample $S_k$ of the feedback signal $S_{FB}$ present at the feedback input $IN_{FB}$.

In particular, after the interval $T_{CONV}$, the ADC module 22 generates the new sample $S_k$, which is added to the first accumulator block 32, the previous value of which was ACC(k−1), thus determining its new value ACC(k).

In an asynchronous manner, a query is arriving from the low-voltage section 10a over the communication channel 15. The first integrity check block 35 validates the query and answers with the average content of the first accumulator block 32, ACC(k)/NSAMPLES_HV; then, the first accumulator block 32 is reset.

The data propagate over the communication channel 15 and reach the low-voltage section 10a, where they are validated by the second integrity check block 37 and, if valid, added to the second accumulator block 38, which evolves from the previous value ACC(z−1) (for example, a value equal to zero) to a new value ACC(z), which is therefore a function of the aforesaid average content of the first accumulator block 32, ACC(k)/NSAMPLES_HV.

The PWM generator block 39 then generates the feedback output signal $S_{out\_FB}$, with fixed frequency $f_{OUT\_PWM}$ and duty-cycle determined by the average value of the second accumulator block 38 in the previous period, according to the expression: $T'_{ONz-1} = f(ACC_{z-1}/NSAMPLES\_LV)$.

Figure 5:
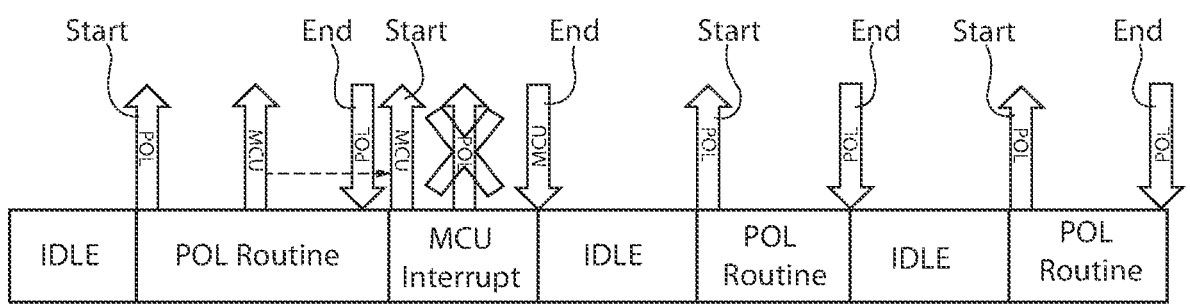
FIG. 5 shows a further diagram regarding operation of the isolated gate driver device of FIG. 2.

According to a further aspect of the present solution, any conflict between the polling routine and possible asynchronous queries (interrupts, INT) coming directly from the control stage 12 (and from the corresponding microcontroller), for example for diagnostic purposes, are handled as represented schematically in FIG. 5 and as described now in detail.

In particular, maximum priority is assigned to the polling routine associated with the analog-to-digital conversion. In the case where the polling query (POL) for reading a new sample of the signal acquired and the asynchronous query (MCU Interrupt) by the control stage 12 arrive simultaneously, the polling query is served first; the query coming from the control stage 12 is stored in a buffer and delayed until the analog-to-digital conversion routine is completed. This prevents overflow of the first accumulator block 32, since this strategy guarantees that the same first accumulator block 32 is constantly emptied within a time interval compatible with the maximum switching frequency (for example, equal to 40 kHz).

During the time interval in which the routine originating from the direct query from the control stage 12 interrupts the analog-to-digital conversion routine, any polling query is rejected. However, the first accumulator block 32 guarantees that no loss of data will occur, accumulating new measurement samples even during the time interval when the aforesaid query originated by the control stage 12 is served.

The advantages of the present solution are clear from the foregoing description.

In any case, it is pointed out that the isolated gate driver device 10 allows to:
- guarantee real-time acquisition of the feedback signals $S_{FB}$, indicative of the operation of the power stage 14, so as to implement an optimal control strategy;
- guarantee acquisition even in the case of very low or very high duty-cycle of the PWM control signal;
- guarantee a maximum immunity to disturbance;
- exploit a possibly already existing half-duplex communication channel (for example, dedicated to communications originating directly from the control stage 12) for exchange of data between the low-voltage and high-voltage sections 10a, 10b;
- prevent data losses even in the case of reduced speed of communication and in the case where the communication is interrupted by asynchronous commands received by the control stage 12;
- prevent the use of timestamps to guarantee integrity of the data and temporal coherence; and
- enable on-demand conversions activated by the control stage 12, even when the PWM signal is not switching.

In particular, as discussed previously, the isolated gate driver device 10 is provided internally with the control-logic block 30 so as to determine autonomously and without any external interventions the optimal times and modalities for analog-to-digital conversion and acquisition of new samples of the aforesaid feedback signals $S_{FB}$.

Furthermore, the use of the first and second accumulator blocks 32, 38 in the high-voltage section 10b and, respectively, low-voltage section 10a, allows to prevent any loss of data (basically, providing anti-aliasing filters in order to respect the Nyquist criterion), even in the case of asynchronous operation (and therefore different frequencies) of the polling routine, of the ADC routine, and moreover of the PWM generation of the feedback output signals $S_{out\_FB}$.

The aforesaid advantageous features are moreover obtained within a totally integrated device, with minimum occupation of area, given that the presence of external devices is not required.

In particular, the feedback output signals $S_{out\_FB}$ for the control stage 12 could be generated by the second interface module 36 with an encoding different from the PWM encoding described previously.

In addition, it is again pointed out that the solution described can find advantageous application for any switching power system, in which isolated driving of gate terminals of switches designed to implement power transfer is required.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method comprising:
   receiving, at a control input of a low-voltage section of a gate driver, a PWM control signal with a switching frequency;
   providing, at an output of a high-voltage section of the gate driver, a gate-driving signal as a function of the PWM control signal to a power stage, wherein the high-voltage section is galvanically isolated from the low-voltage section, receiving, at a feedback input of the high-voltage section, at least one feedback signal indicative of an operation of the power stage;

converting, at an ADC module of the high-voltage section, the feedback signal into a digital data stream;

providing, to the ADC module, a conversion-trigger signal designed to determine a start of a conversion for acquiring a new sample of the feedback signal; and sending, via an isolation communication channel between the low-voltage section and the high-voltage section, the digital data stream to the low-voltage section.

2. The method according to claim 1, further comprising:

acquiring, by a conversion-control module of the high-voltage section, a signal indicative of an operating status, either ON or OFF, at the output;

providing a status signal indicative of the operating status; and generating the conversion-trigger signal as a function of a duration of an ON interval and an OFF interval and as a function of the status signal.

3. The method according to claim 2, further comprising:

acquiring a value of a gate-to-source voltage associated with a switch in the power stage; and comparing the value with a threshold value so as to detect ON and OFF transitions of the switch and consequently the operating status.

4. The method according to claim 3, measuring the duration of the ON interval and the OFF interval associated with the operating status, wherein a timer of the conversion-control module is reset at each transition so as to measure the duration of the ON and OFF intervals.

5. The method according to claim 4, further comprising storing, at a first register coupled to the timer, the duration of the ON interval, and storing, at a second register coupled to the timer, the duration of the OFF interval.

6. The method according to claim 2, further comprising determining the start of the conversion at a center of the ON interval when the duration of the ON interval is compatible with a conversion time implemented by the ADC module for acquiring the new sample of the feedback signal, or at a center of the OFF interval when the duration of the ON interval is not compatible with the conversion time.

7. The method according to claim 6, wherein the start of the conversion is determined:

at the center of the ON interval (TON) when TON>TCONV+TGUARD, at the center of the OFF interval (TOFF) when TON≤TCONV+TGUARD, and wherein TGUARD is a guard-time interval, TON is the duration of the ON interval, TOFF is the duration of the OFF interval, and TCONV is the duration of the conversion time.

8. The method according to claim 1, wherein the new sample of the feedback signal is acquired at each period of the PWM control signal.

9. The method according to claim 1, further comprising:

receiving, at a first interface module of the high-voltage section, the digital data stream from the ADC module; and transmitting the data stream to the communication channel.

10. The method according to claim 9, further comprising accumulating, at a first accumulator of the first interface module, a number of samples resulting from analog-to-digital conversions by the ADC module so as to match a frequency of the PWM control signal to a different communication frequency associated with the communication channel.

11. The method according to claim 10, further comprising resetting the first accumulator whenever a request for data arrives from the communication channel.

12. The method according to claim 1, further comprising:

receiving, at a second interface of the low-voltage section, the digital data stream from the communication channel; and generating, at a PWM generator, feedback output signals with an output frequency for sending the feedback output signals to a control stage.

13. The method according to claim 12, further comprising accumulating, a second accumulator of the second interface, a number of samples transmitted over the communication channel in order to match the output frequency to a different communication frequency associated with the communication channel.

14. The method according to claim 13, further comprising resetting the second accumulator at each new period of a feedback output signal generated by the PWM generator.

15. The method according to claim 13, wherein the output frequency of the feedback output signals generated by the PWM generator is fixed, and wherein a corresponding duty-cycle is determined by an average content of the second accumulator.

16. The method according to claim 1, wherein the high-voltage section and the low-voltage section comprise, respectively, a first integrity check block and a second integrity check block, which are coupled to the communication channel and are configured to check integrity of data transmitted over the communication channel.

17. The method according to claim 1, wherein the ADC module is a sigma-delta converter with a conversion time of less than half of a switching period, given by an inverse of the switching frequency.

18. A method comprising:

receiving, at a low-voltage section of a gate driver, a PWM control signal;

transferring the received signal to a high-voltage section of the gate driver through an isolation barrier generating a driving signal;

activating a timer when a gate-to-source voltage of a switch in a power stage based on the driving signal exceeds a pre-set threshold value;

generating, at the high-voltage section, a conversion trigger signal when the timer reaches a threshold;

acquiring, at the high-voltage section, a new sample of a feedback signal; and adding, at the high-voltage section, the new sample to a first accumulator.

19. The method according to claim 18, further comprising:

receiving, from the low-voltage section, a query;

validating, at an integrity check block of the high-voltage section, the query;

responding to the query with an average content of the first accumulator; and resetting the first accumulator.

20. The method according to claim 19, further comprising:
  receiving, at the low-voltage section from the high-voltage section, data;
  validating, at an integrity check block of the low-voltage section, the data; and
  adding, to a second accumulator, the data.

* * * * *